(12) United States Patent
Takai

(10) Patent No.: US 9,946,150 B2
(45) Date of Patent: Apr. 17, 2018

(54) LIGHT REFLECTION TYPE LITHOGRAPHY MASK, ITS MANUFACTURING METHOD, MASK DATA GENERATION METHOD AND MASK BLANK

(71) Applicant: Toshiba Memory Corporation, Tokyo (JP)

(72) Inventor: Kosuke Takai, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 139 days.

(21) Appl. No.: 14/847,865

(22) Filed: Sep. 8, 2015

(65) Prior Publication Data

US 2016/0274453 A1 Sep. 22, 2016

(30) Foreign Application Priority Data

Mar. 16, 2015 (JP) .................. 2015-052151

(51) Int. Cl.
*G03F 1/24* (2012.01)
*G03F 1/36* (2012.01)

(52) U.S. Cl.
CPC . *G03F 1/24* (2013.01); *G03F 1/36* (2013.01)

(58) Field of Classification Search
CPC ....................................................... G03F 1/24
See application file for complete search history.

(56) References Cited

U.S. PATENT DOCUMENTS

| 6,313,025 B1 | 11/2001 | Chittipeddi et al. |
| 2009/0305147 A1 | 12/2009 | Constancies |
| 2010/0003608 A1 | 1/2010 | Nakajima et al. |
| 2010/0015800 A1 | 1/2010 | Hara et al. |
| 2011/0287344 A1 | 11/2011 | Irie |
| 2014/0127613 A1 | 5/2014 | Kagawa |
| 2014/0242499 A1 | 8/2014 | Takai |
| 2015/0104734 A1* | 4/2015 | Shih ....................... G03F 7/2004 430/5 |
| 2015/0168845 A1* | 6/2015 | Lu ....................... G03F 7/70441 355/71 |

FOREIGN PATENT DOCUMENTS

| JP | H11305417 A | 11/1999 |
| JP | H11352669 A | 12/1999 |
| JP | 2003257810 A | 9/2003 |
| JP | 2007287907 A | 11/2007 |
| JP | 2008244298 A | 10/2008 |
| JP | 2009135518 A | 6/2009 |
| JP | 2010008921 A | 1/2010 |
| JP | 2011249391 A | 12/2011 |
| JP | 2012049243 A | 3/2012 |
| JP | 2013191663 A | 9/2013 |
| JP | 2014096397 A | 5/2014 |
| JP | 2014168019 A | 9/2014 |

* cited by examiner

*Primary Examiner* — Kathleen Duda

(74) *Attorney, Agent, or Firm* — Patterson & Sheridan, LLP

(57) ABSTRACT

One embodiment of the present invention provides a light reflection type lithography mask including: a substrate; and a reflection layer. The reflection layer is formed on the substrate, and has a first pattern and a second pattern as viewed from above. The second pattern is located so as to be closest to one of one side and the other side of the first pattern in a first direction. A reflectivity at a portion corresponding to the first pattern is different from a reflectivity at a portion corresponding to the second pattern.

13 Claims, 13 Drawing Sheets

LIGHT REFLECTION TYPE LITHOGRAPHY MASK, ITS MANUFACTURING METHOD, MASK DATA GENERATION METHOD AND MASK BLANK

CROSS-REFERENCE TO RELATED APPLICATION(S)

This application claims priority from Japanese Patent Application No. 2015-052151 filed on Mar. 16, 2015, the entire contents of which are incorporated herein by reference.

FIELD

An embodiment described herein generally relates to a light reflection type lithography mask, its manufacturing method, a mask data generation method, and a mask blank.

BACKGROUND

To increase the integration density of semiconductor devices, lithography techniques using extreme ultraviolet (EUV) light in a wavelength range of about 13.5 nm are now being developed. In lithography in such an EUV wavelength range, reflection-type lithography masks are used which have a reflection layer formed by laying molybdenum (Mo) layers and silicon (Si) layers alternately and a light absorbing body formed thereon.

In reflection-type lithography processes, exposure light impinges on a mask from a direction that is inclined from its normal by, for example, about 6° and light reflected from the mask shines on a wafer. To project a high-contrast optical image on the wafer, a light absorbing body is necessary whose thickness (height) is greater than or equal to a prescribed value. However, such a light absorbing body formed on a reflection layer is high in the shadowing effect of interrupting exposure light and causes large dimensional variations in an optical image.

BRIEF DESCRIPTION OF DRAWINGS

A general architecture that implements the various features of the present invention will now be described with reference to the drawings. The drawings and the associated descriptions are provided to illustrate embodiments and not to limit the scope of the present invention.

DETAILED DESCRIPTION

Figure 1A:
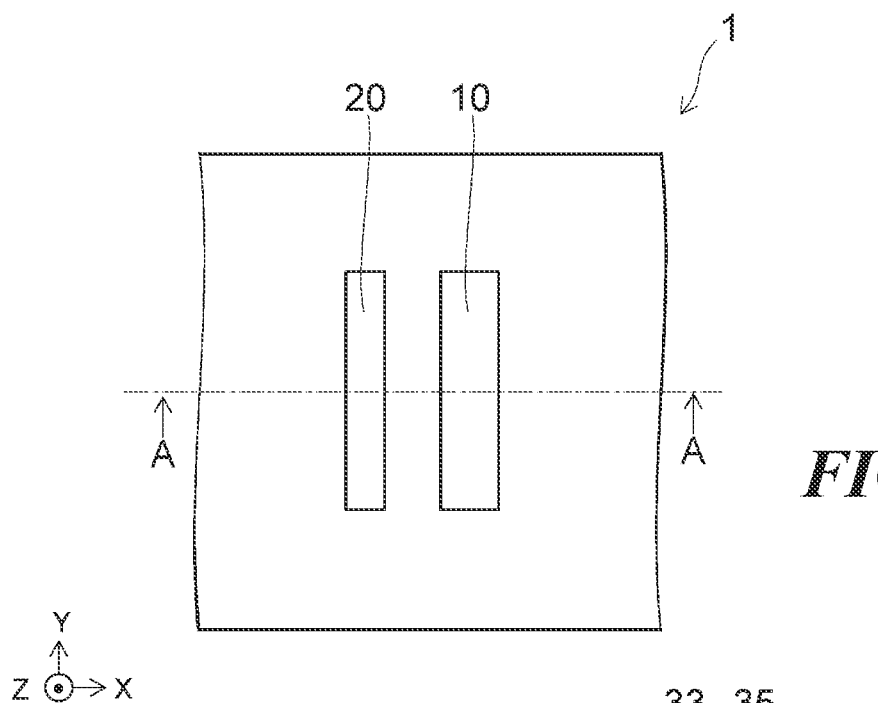
FIGS. 1A and 1B are schematic views showing a light reflection type lithography mask according to a first embodiment.

Embodiments will be hereinafter described with reference to the drawings. The same portions, layers, etc. in the drawings are denoted by the same reference symbol and will not be described in detail redundantly, that is, only portions, layers, etc. will be described in detail when they appear for the first time. Drawings showing structures are schematic or conceptual ones, and the ratio between the thickness and the width of each portion, layer or the like, the ratio between the sizes of different portions, layers, etc., and like items are not necessarily the same as actual ones. In different drawings, the same portion, layer, or the like may be drawn so as to have different ratios between its dimensions.

The arrangement and structures of individual portions, layers, etc. will be described using the orthogonal X, Y, and Z axes which represent the X, Y, and Z directions, respectively. The Z direction may represent the upward direction with the direction opposite to it referred to as the downward direction.

Embodiment 1

Figure 1B:
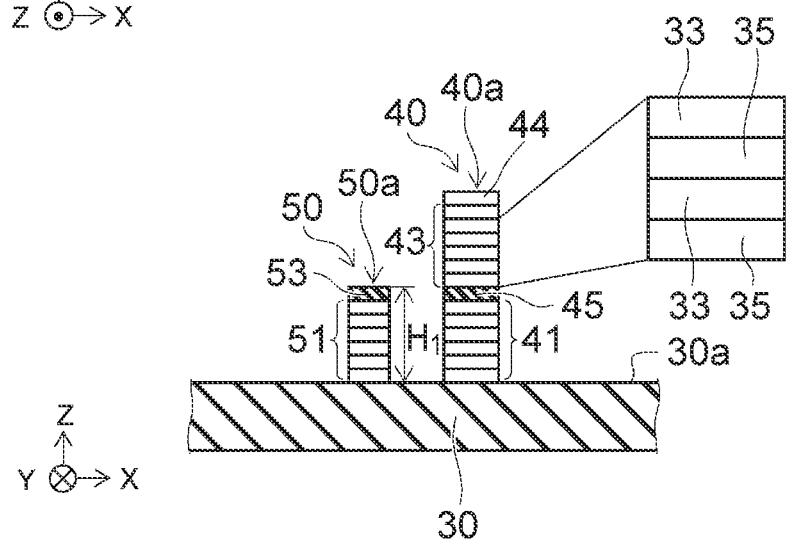

FIGS. 1A and 1B are schematic views showing a light reflection type lithography mask (hereinafter referred to as a lithography mask 1) according to a first embodiment. FIG. 1A is a schematic plan view of the lithography mask 1 and FIG. 1B is a sectional view of the lithography mask 1 taken along line A-A in FIG. 1A.

As shown in FIG. 1A (top view), the lithography mask 1 has a first pattern 10 and a second pattern 20 which are, for example, stripe-shaped patterns extending in the Y direction. The first pattern 10 and the second pattern 20 are arranged in a first direction (hereinafter referred to as the X direction). In this example, the second pattern 20 is closest to one side of the first pattern 10 in the X direction. The term "closest" hereto means that there is no pattern between the first pattern 10 and the second pattern 20. The second pattern 20 functions as a sub-resolution assist feature (SRAF) pattern. The second pattern 20 may be disposed so as to be closest to the other side of the first pattern 10 in the X direction.

As shown in FIG. 1B, the lithography mask 1 has a substrate 30 and a first lamination body 40 and a second lamination body 50 which are formed on a top surface 30a of the substrate 30. A top surface 40a of the first lamination body 40 has the shape of the first pattern 10, and a top surface 50a of the second lamination body 50 has the shape of the second pattern 20. For example, the substrate 30 is a transparent glass substrate. The substrate 30 may be a light absorbing body that absorbs exposure light.

The first lamination body 40 includes reflection layers 41 and 43, a cap layer 44, and an intermediate layer 45 which is sandwiched between the reflection layers 41 and 43. Each of the reflection layers 41 and 43 has a structure that first layers 33 and second layers 35 are laid alternately. The first layers 33 are different in refractive index from the second layers 35. That is, each of the reflection layers 41 and 43 has a structure that layers having different refractive indices are laid alternately. The intermediate layer 45 contains a material that is different from the materials of the first layers 33 and the second layers 35. For example, the first layers 33 are molybdenum layers and the second layers 35 are silicon layers. For example, the cap layer 44 is a ruthenium (Ru) layer and the intermediate layer 45 is a silicon oxide film.

The second lamination body 50 includes a reflection layer 51 and a cap layer 53 formed thereon. The reflection layer 51 has a structure that first layers 33 and second layers 35 are laid alternately. The cap layer 53 contains a material that is different from the materials of the first layers 33 and the second layers 35. For example, the cap layer 53 is a silicon oxide film. The height $H_1$ of the second lamination body 50 as measured from the substrate 30 is the same as the height of the reflection layer 41 and the intermediate layer 45 combined. That is, the first lamination body 40 is taller than the second lamination body 50.

The lithography mask 1 according to this embodiment can lower the shadowing effect because as described above the reflection layers 41, 43, and 51 are formed on the substrate 30 which is a transparent body or a light absorbing body. As a result, size variations or positional deviations of an optical image projected on a wafer can be suppressed.

Figure 2A:
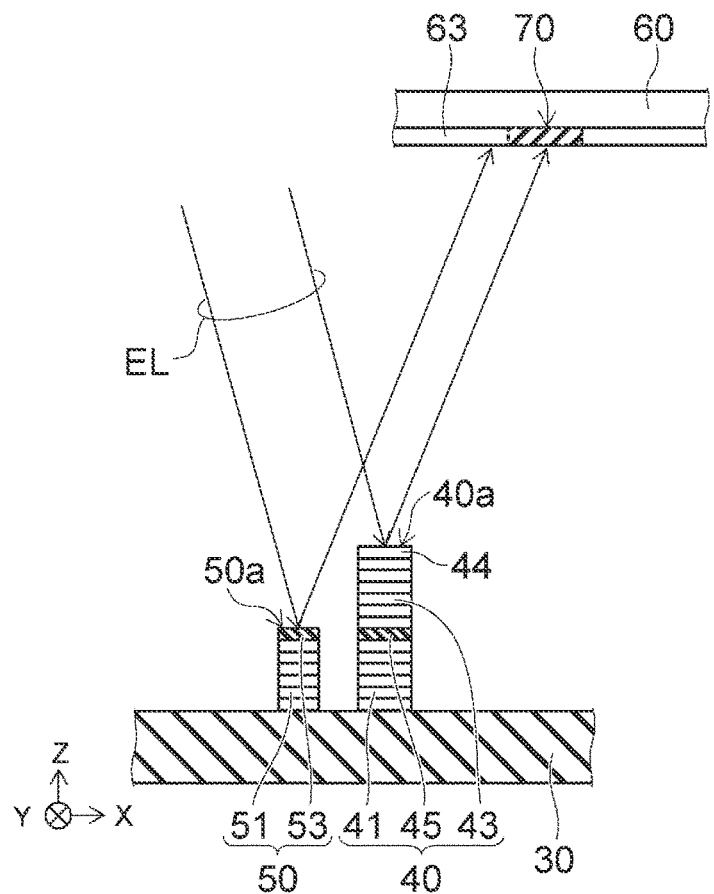
FIGS. 2A and 2B are schematic diagrams illustrating a characteristic of the light reflection type lithography mask according to the first embodiment.
Figure 2B:
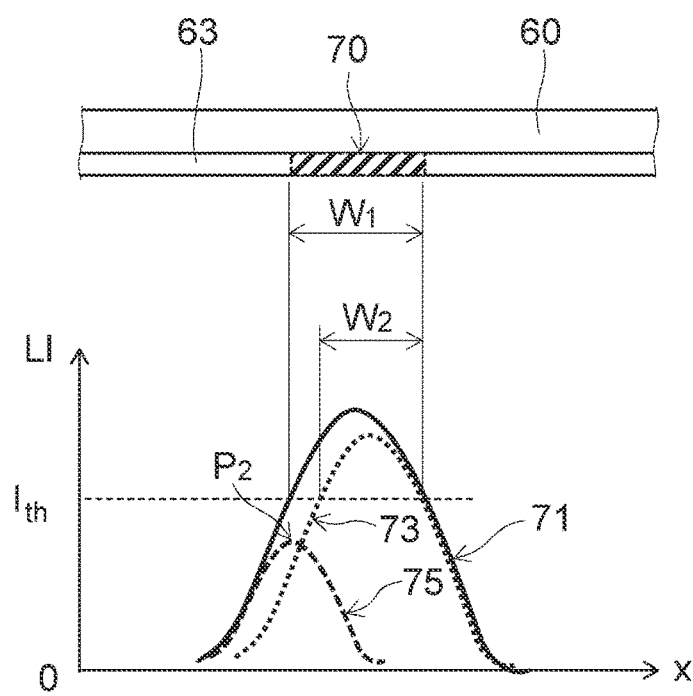

FIGS. 2A and 2B are schematic diagrams illustrating a characteristic of the lithography mask 1 according to the first embodiment. As shown in FIG. 2A, for example, a wafer 60 is placed obliquely above the lithography mask 1 and illuminated with exposure light EL, more strictly, its reflection component that is reflected from the first lamination body 40 and the second lamination body 50. The surface, to be illuminated with the reflection component of the exposure light EL, of the wafer 60 is coated with a photoresist 63. FIG. 2B shows intensity distributions 71, 73, and 75 of the reflection component of exposure light EL that shines on the resist 63. The horizontal axis represents the position in the X direction and the vertical axis represents the intensity of the reflection component of the exposure light EL.

As shown in FIG. 2A, the exposure light EL impinges on the lithography mask 1 from a direction that is inclined from its normal (the normal direction is hereinafter referred to as the Z direction) by a prescribed angle θ (e.g., 6°). The exposure light EL is reflected by the first lamination body 40 and the second lamination body 50 and shines on the wafer 60.

Although for the sake of convenience FIG. 2A is drawn as if the exposure light EL were reflected by the top surfaces 40a and 50a of the first lamination body 40 and the second lamination body 50, actually it is reflected by the interfaces between the first layer 33 and the second layers 35 of the first lamination body 40 and the second lamination body 50. As a result, each of the first lamination body 40 and the second lamination body 50 exhibits a higher reflectivity as the number of first layers 33 and second layers 35 increases. Therefore, the first lamination body 40 which has more first layers 33 and second layers 35 than the second lamination body 50 exhibits a higher reflectivity than the latter. The term "reflectivity" as used herein means a ratio of reflection light to parallel light that impinges on the first lamination body 40 and the second lamination body 50 from above or obliquely above. The reflectivity is high when the intensity distribution of reflection light has a large peak value.

The intensity distribution 71 shown in FIG. 2B is an intensity distribution of the reflection component of exposure light EL that is reflected from both of the first lamination body 40 and the second lamination body 50. The intensity distribution 73 (dotted line) shown in FIG. 2B is an intensity distribution of that part of the exposure light EL which is reflected from the first lamination body 40. The intensity distribution 75 (broken line) shown in FIG. 2B is an intensity distribution of that part of the exposure light EL which is reflected from the second lamination body 50. That is, the intensity distribution 71 is the sum of the intensity distributions 73 and 75.

For example, the intensity level $I_{th}$ shown in FIG. 2B represents a threshold sensitivity level of the resist 63. The resist 63 is a negative resist, for example, and its portion illuminated with a portion, having a higher intensity than $I_{th}$, of the reflection component of the exposure light EL (an optical image 70 is formed there) remains on the wafer 60 after the exposure. On the other hand, a portion of the resist 63 illuminated with a portion, having a lower intensity than $I_{th}$, of the reflection component of the exposure light EL is removed by the exposure. In this manner, a lithography image can be formed on the wafer 60 by exposure using the lithography mask 1 and subsequent development.

The resolution limit level of a photoresist depends on both of the intensity of exposure light and the exposure time. For example, the resolution limit level is defined as a total amount of exposure that is a time integration of exposure intensity. The threshold sensitivity level $I_{th}$ shown FIG. 2B means a resolution limit intensity of exposure light EL in which the exposure time is kept constant.

As shown in FIG. 2B, the width $W_1$, in the X direction, of the optical image 70 that is projected by reflection by the first lamination body 40 and the second lamination body 50 is greater than the width $W_2$ of an optical image projected by reflection by only the first lamination body 40. That is, the reflection by the second lamination body 50 widens the intensity distribution, in the X direction, of the reflection component of the exposure light EL on the wafer 60, whereby the width $W_1$ of the optical image 70 in the X direction is increased.

It is desirable that the peak $P_2$ of the intensity distribution 75 of the reflection component of the exposure light EL reflected from the second lamination body 50 be lower than the threshold sensitivity level $I_{th}$. That is, the second lamination body 50 is what is called a sub-resolution assist feature (SRAF) and adds an exposure light quantity that is lower than the resolution limit level.

For example, where the first pattern 10 which corresponds to the first lamination body 40 is an isolated pattern that is distant from an adjacent pattern, there may occur an event that the light quantity of the reflection component of exposure light becomes unduly small. In such a case, it is effective to compensate the exposure light quantity by forming the second lamination body 50 as an SRAF. The SRAF becomes more effective when circuit patterns of semiconductor devices are made smaller and the half pitch (hp) of interconnections becomes on the order of 10 nm.

If a size of an SRAF is simply made even smaller for such fine circuit patterns, the aspect ratio of the SRAF is increased. In this case, a lithography mask manufacturing process faces more difficulty, and a strength of the SRAF is lowered. As a result, for example, an SRAF pattern may be damaged in a process such as a mask cleaning. In contrast, in the embodiment, a reflectivity of an SRAF is lowered more than a resolution limit level not by adjusting its size but by adjusting its height. Thus, the size of the SRAF can be kept as the size of the circuit pattern, so that the SRAF having the small aspect can be realized. As a result, the difficulty in the lithography mask manufacturing process can be relieved, and the strength of the SRAF can be increased. The term "aspect ratio" means a ratio of a lamination body, for example, to its width.

The increase in the strength of SRAFs makes a lithography mask more durable and increases the number of times of exposure using it. As a result, the frequency of inspection of a lithography mask can be lowered. Furthermore, the probability of damaging of mask patterns can be reduced and the production yield can be increased.

Next, a manufacturing method of the lithography mask 1 according to the first embodiment will be described with reference to FIGS. 3A-3D and FIGS. 4A-4D. FIGS. 3A-3D and FIGS. 4A-4D are schematic sectional views illustrating a manufacturing process of the lithography mask 1 in order.

Figure 3A:
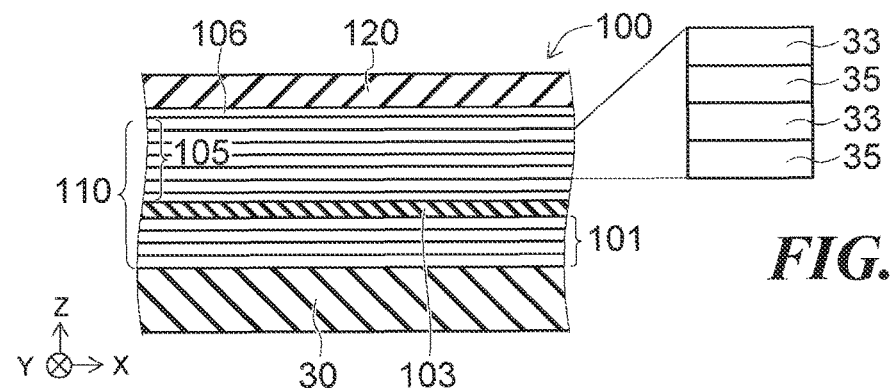
FIGS. 3A-3D are a first set of schematic sectional views illustrating a manufacturing process of the light reflection type lithography mask according to the first embodiment.

FIG. 3A is a schematic sectional view showing a mask blank 100 that is used for manufacture of the lithography mask 1. For example, the mask blank 100 has a substrate 30, a reflection layer 110, and a hard mask layer 120. The reflection layer 110 is formed on the substrate 30 and the hard mask layer 120 is formed on the reflection layers 110. A cap layer 106 is formed between the hard mask layer 120 and the reflection layer 110.

The reflection layer 110 has a first lamination portion 101, an intermediate layer 103, and a second lamination portion 105. The first lamination portion 101 is formed on the substrate 30. The intermediate layer 103 is formed between the first lamination portion 101 and the second lamination portion 105.

Each of the first lamination portion 101 and the second lamination portion 105 has a structure that first layers 33 and second layers 35 are laid alternately. For example, the first layers 33 are molybdenum layers and the second layers 35 are silicon layers. For example, the first lamination portion 101 consists of 10 pairs of a first layer 33 and a second layer 35. For example, the second lamination portion 105 consists of 30 pairs of a first layer 33 and a second layer 35.

The intermediate layer 103 is made of a material that is different from the materials of the first layer 33 and the second layer 35. For example, the intermediate layer 103 is a 4-nm-thick silicon oxide film.

For example, the hard mask layer 120 has a multilayer structure that a tantalum nitride (TaN) layer and a tantalum oxide (TaO) layer are laid successively. The uppermost layer of the second lamination portion 105 is a silicon layer, for example, and the cap layer 106 is formed directly on the silicon layer.

Figure 3B:
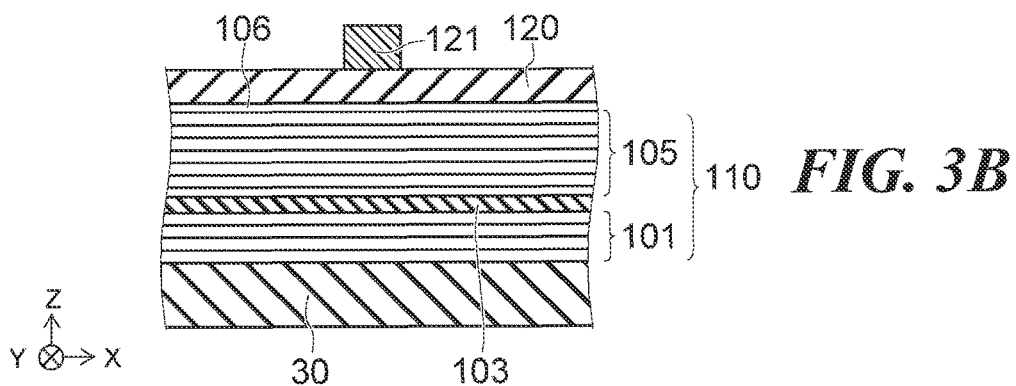

As shown in FIG. 3B, for example, a resist mask 121 is formed on the hard mask layer 120 so as to have the shape of the first pattern 10 as viewed from above. The resist mask 121 is formed by electron beam exposure, for example.

Figure 3C:
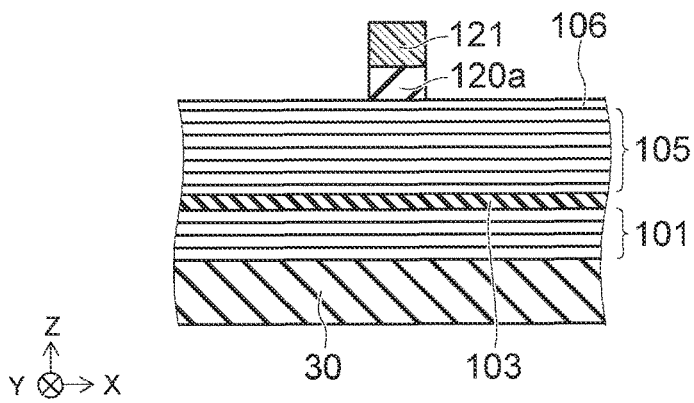

As shown in FIG. 3C, the hard mask layer 120 is removed selectively using the resist mask 121, whereby an etching mask 120a is formed so as to have the shape of the first pattern 10 as viewed from above.

Figure 3D:
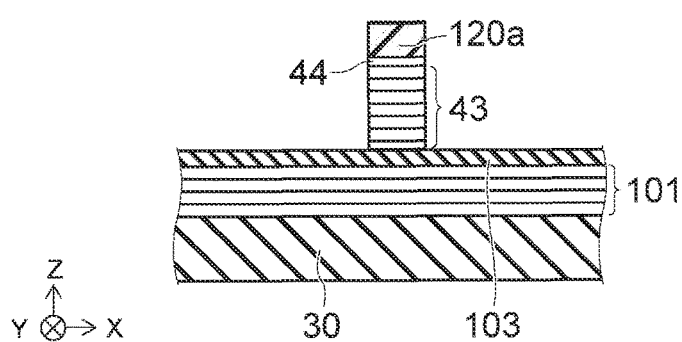

As shown in FIG. 3D, the second lamination portion 105 is removed selectively using the etching mask 120a. As a result, a reflection layer 43 of a first lamination body 40 is formed and the top surface of the intermediate layer 103 is exposed. The second lamination portion 105 is removed selectively under such conditions that the first layers 33 and the second layers 35 are etched and the intermediate layer 103 is not. Alternatively, the second lamination portion 105 may be removed selectively under such etching conditions that the etching rates of the first layers 33 and the second layers 35 are higher than the etching rate of the intermediate layer 103. Thus, the intermediate layer 103 functions as an etching stopper.

Figure 4A:
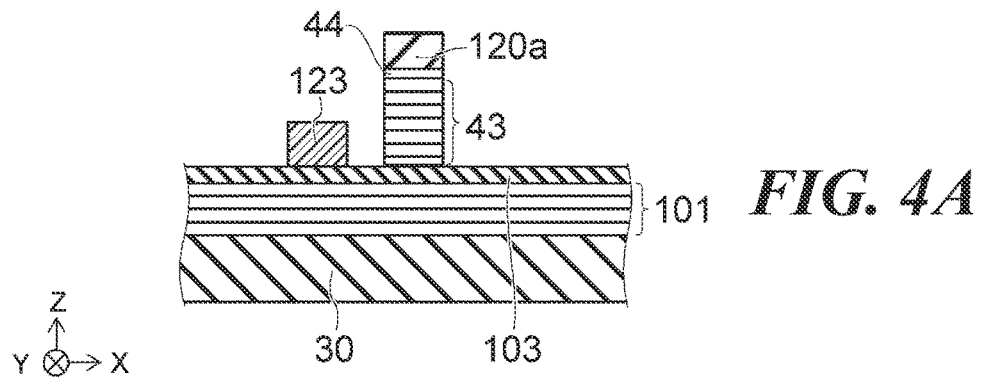
FIGS. 4A-4D are a second set of schematic sectional views illustrating the manufacturing process of the light reflection type lithography mask subsequent to the manufacturing process shown in FIG. 3.

As shown in FIG. 4A, a resist mask 123 is formed on the intermediate layer 103 so as to have the shape of the second pattern 20 as viewed from above. The resist mask 123 is formed by electron beam exposure, for example.

Figure 4B:
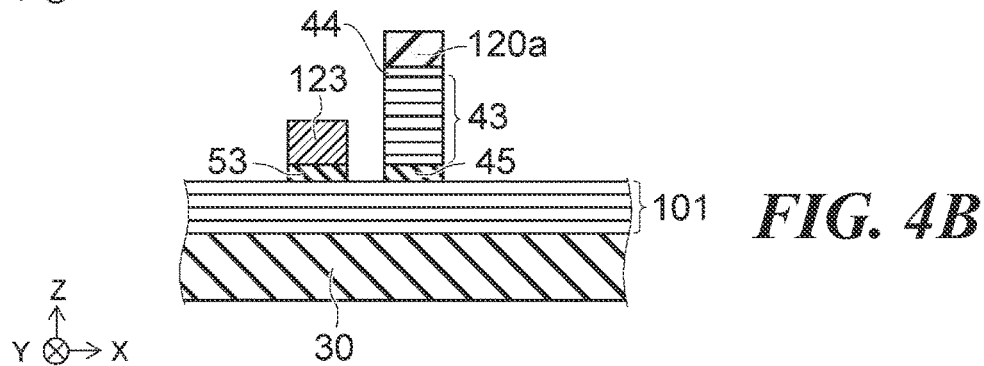

As shown in FIG. 4B, the exposed portions of the intermediate layer 103 are removed using the reflection layer 43 and the resist mask 123 as an etching mask. As a result, an intermediate layer 45 of the first lamination body 40 and a cap layer 53 of a second lamination body 50 are formed.

Figure 4C:
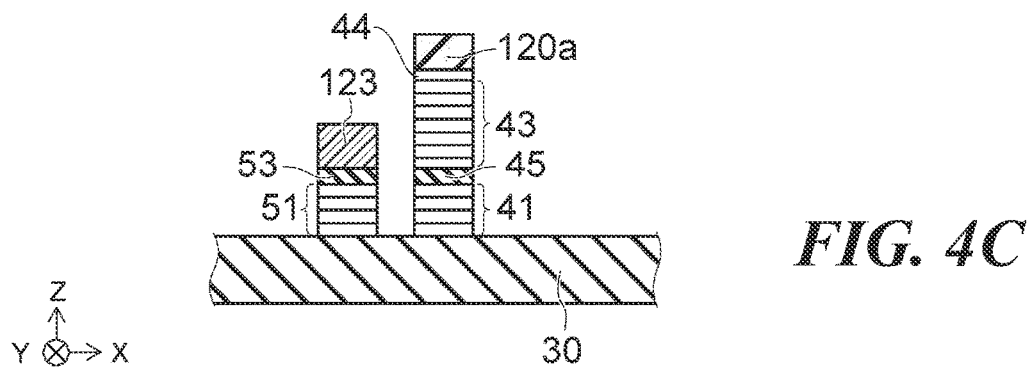

As shown in FIG. 4C, the exposed portions, corresponding to the removed portions of the intermediate layer 103, of the first lamination portion 101 are removed. As a result, a reflection layer 41 of the first lamination body 40 and a reflection layer 51 of the second lamination body 50 are formed. The first lamination portion 101 is removed selectively by anisotropic RIE (reactive ion etching), for example. That is, the first lamination portion 101 is etched selectively under such conditions that the etching rate in the Z direction is higher than that in the X and Y directions.

Figure 4D:
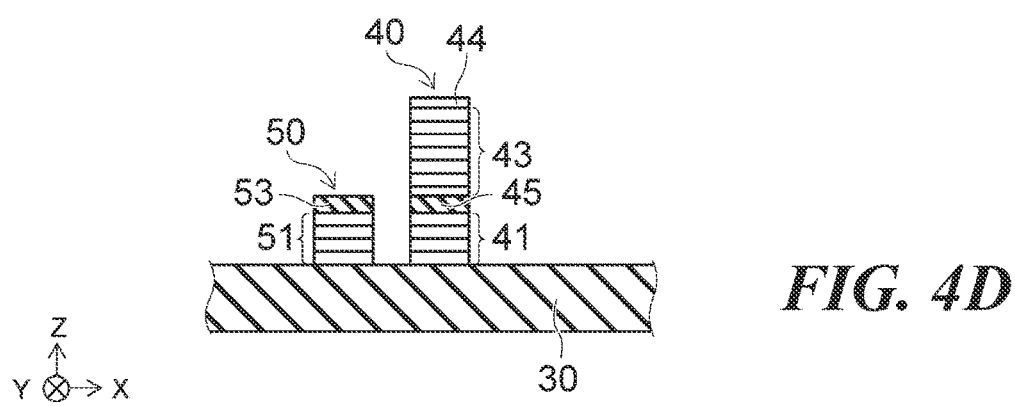

As shown in FIG. 4D, the etching mask 120a and the resist mask 123 are removed to complete a lithography mask 1.

According to the embodiment, since the intermediate layer 103 functions as an etching stopper, second lamination bodies 50 (SRAFs) can be formed so as to have a uniform height distribution. As a result, the uniformity of an optical image 70 projected on the wafer 60 can be increased.

Figure 5A:
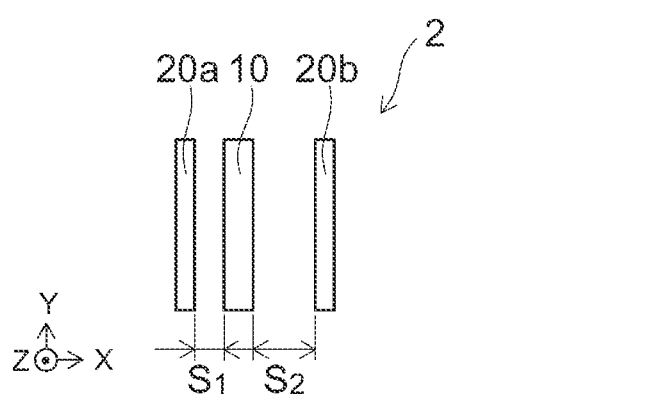
FIGS. 5A and 5B are schematic plan views of light reflection type lithography masks according to a modification of the first embodiment, respectively.
Figure 5B:
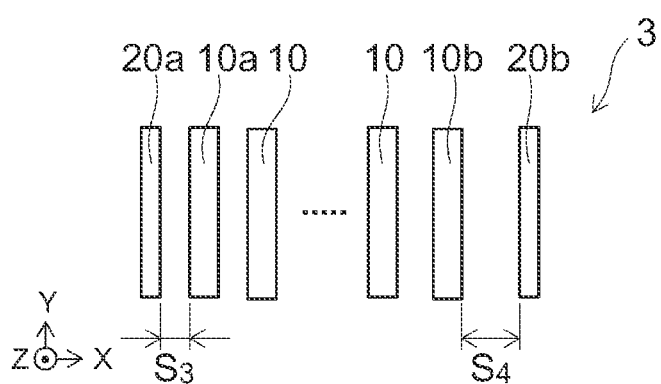

FIGS. 5A and 5B are schematic plan views of lithography masks 2 and 3 according to a modification of the first embodiment, respectively.

The lithography mask 2 shown in FIG. 5A has a first pattern 10 and a second pattern 20a and a third pattern 20b which are disposed on the two respective sides of the first pattern 10. The first pattern 10, the second pattern 20a, and the third pattern 20b are arranged in the X direction. The second pattern 20a is closest to one side of the first pattern 10, and the third pattern 20b is closest to the other side of the first pattern 10.

The second pattern 20a and the third pattern 20b are SRAF patterns, and the reflectivity of second lamination bodies 50 having the shapes of the second pattern 20a and the third pattern 20b, respectively, is lower than that of a first lamination body 40 having the shape of the first pattern 10. More specifically, the second lamination bodies 50 are lower than the first lamination body 40. As described later, the interval $S_1$ between the second pattern 20a and the first pattern 10 and the interval $S_2$ between the third pattern 20b and the first pattern 10 are set so as to suppress the shadowing effect of the first lamination body 40 and thereby make positional deviations or deformation of an optical image 70 fall within an allowable range. For example, where exposure light EL impinges on the first pattern 10, the second pattern 20a, and the third pattern 20b in the X direction as viewed from above, $S_2$ is set larger than $S_1$. The structure in which SRAF patterns (second pattern 20a and third pattern 20b) are formed on the two respective sides of a main pattern (first pattern 10) is effective in, for example, a case that the main pattern is an isolated pattern.

The lithography mask 3 shown in FIG. 5B has plural first patterns 10 and a second patter 20a and a third pattern 20b which are disposed on the two respective sides of the first patterns 10. The first patterns 10 are what is called LS (line and space) patterns and are arranged in the X direction. The second pattern 20a is disposed on one side of the first patterns 10 in the X direction, and the third pattern 20b is disposed on the other side of the first patterns 10. The second pattern 20a is closest to an end first pattern 10a of the first patterns 10 at the one side, and the third pattern 20b is closest to another end first pattern 10b of the first patterns 10 at the other side. The interval $S_3$ between the second pattern 20a and the adjacent first pattern 10a and the interval $S_4$ between the third pattern 20b and the adjacent first pattern 10b are set so as to suppress the shadowing effects of lamination bodies having the shapes of the first patterns 10a and 10b, respectively. As in this example, SRAF patterns are disposed on the two respective sides of LS patterns. In addition, where exposure light EL impinges in the X direction as viewed from above, $S_4$ is set larger than $S_3$. As a result, for example, thinning or positional deviations of both end patterns of LS patterns can be suppressed.

Embodiment 2

Figure 6A:
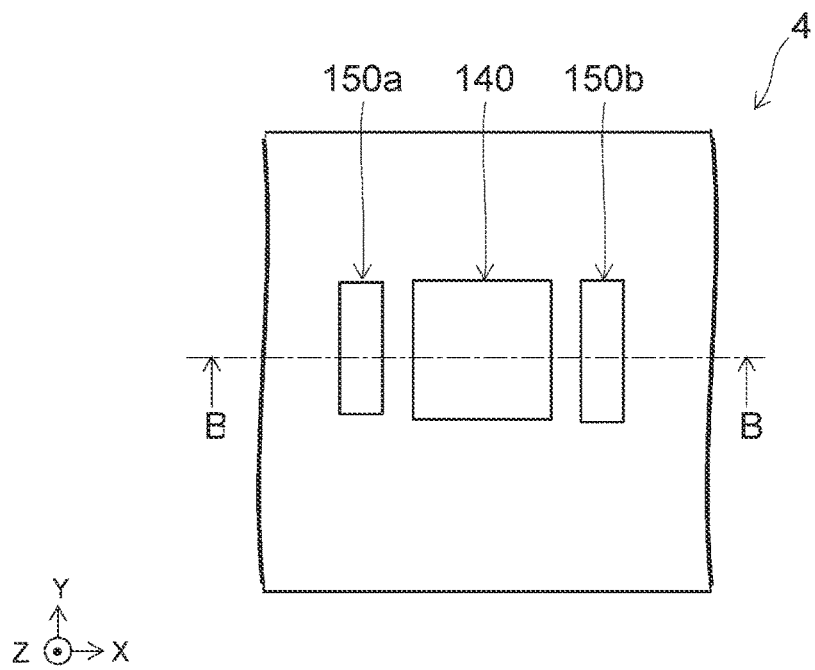
FIGS. 6A and 6B are schematic views showing a light reflection type lithography mask according to a second embodiment.
Figure 6B:
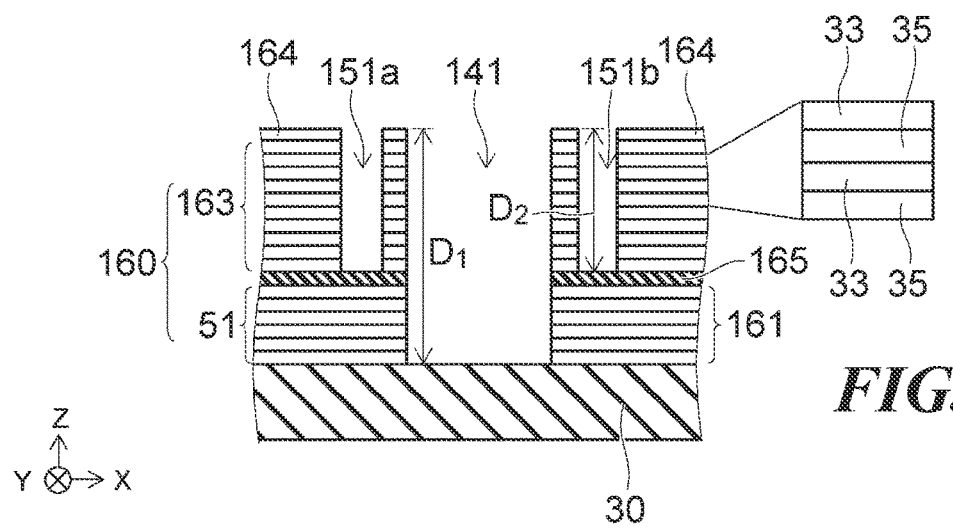

FIGS. 6A and 6B are schematic views showing a lithography mask 4 according to a second embodiment. FIG. 6A is a schematic plan view of the lithography mask 4 and FIG. 6B is a sectional view of the lithography mask 4 taken along line B-B in FIG. 6A.

As shown in FIG. 6A (top view), the lithography mask 4 has a first pattern 140, a second pattern 150a, and a third pattern 150b which are arranged in the X direction as viewed from above. The second pattern 150a is closest to one side of the first pattern 140, and the third pattern 150b is closest to the other side of the first pattern 140. This embodiment is not limited to this configuration; one of the second pattern 150a and the third pattern 150b may be omitted.

As shown in FIG. 6B, the lithography mask 4 has a substrate 30 and a reflection layer 160 formed thereon. The reflection layer 160 has a first lamination portion 161, a second lamination portion 163, and an intermediate layer 165. A cap layer 164 is formed on the second lamination portion 163. The first lamination portion 161 is formed on the substrate 30 and the intermediate layer 165 is formed between the first lamination portion 161 and the second lamination portion 163.

Each of the first lamination portion 161 and the second lamination portion 163 has a structure that first layers 33 and second layers 35 are laid alternately. The refractive index of the first layers 33 is different from that of the second layers 35. The intermediate layer 165 contains a material that is different from the materials of the first layers 33 and the second layers 35.

The reflection layer 160 includes a first hole 141, a second hole 151a, and a third hole 151b which have opening ends having the shapes of the first pattern 140, the second pattern 150a, and the third pattern 150b, respectively.

The reflectivity of the first hole 141 is lower than that of the second hole 151a and the third hole 151b. That is, the depth $D_1$ is greater than the depth $D_2$ of the second hole 151a and the third hole 151b.

Figure 7A:
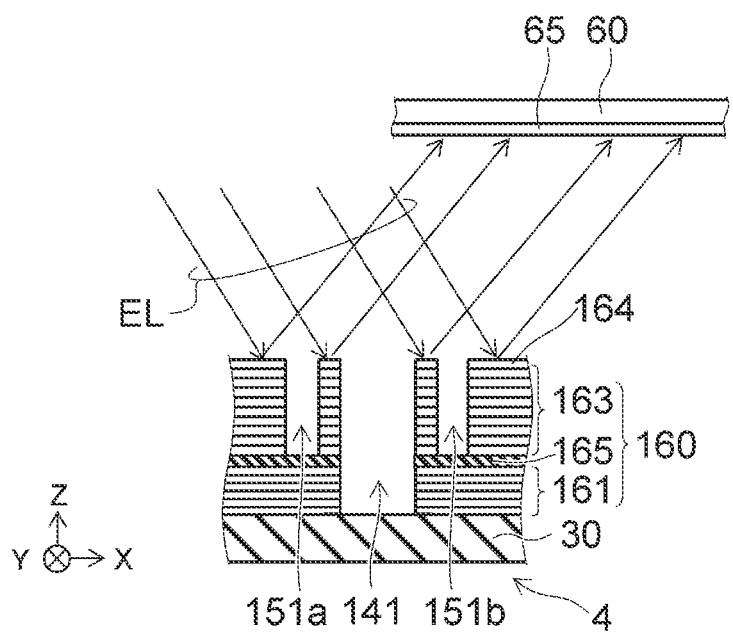
FIGS. 7A and 7B are schematic diagrams illustrating a characteristic of the light reflection type lithography mask according to the second embodiment.
Figure 7B:
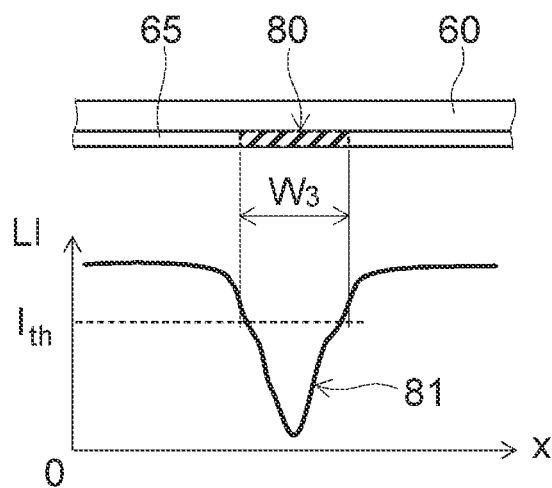

FIGS. 7A and 7B are schematic diagrams illustrating a characteristic of the lithography mask 4 according to the second embodiment. As shown in FIG. 7A, for example, the lithography mask 4 is illuminated with exposure light EL from obliquely above and resulting reflection light shines on a wafer 60 that is placed obliquely above the lithography mask 4. The exposure light EL impinges on the reflection layer 160 from obliquely above, for example, from a direction that is inclined from the Z direction by 6°. The surface of the wafer 60 is coated with a photoresist 65 and exposed to the reflection component of the exposure light EL.

FIG. 7B shows an intensity distribution 81 of the reflection component of exposure light EL that shines on the photoresist 65. The horizontal axis represents the position in the X direction and the vertical axis represents the intensity LI of the reflection component of the exposure light EL. The photoresist 65 is a positive resist, for example, and its portion exposed to the reflection component of the exposure light EL is removed by the exposure. Symbol $I_{th}$ in FIG. 7B represents a threshold sensitivity level of the photoresist 65. A portion of the photoresist 65 illuminated with a portion, having a higher intensity than $I_{th}$, of the reflection component of the exposure light EL is removed by the exposure. On the other hand, a portion of the photoresist 65 illuminated with a portion, having a lower intensity than $I_{th}$, of the reflection component of the exposure light EL remains on the wafer 60. A lithography image is thus formed.

Figure 8A:
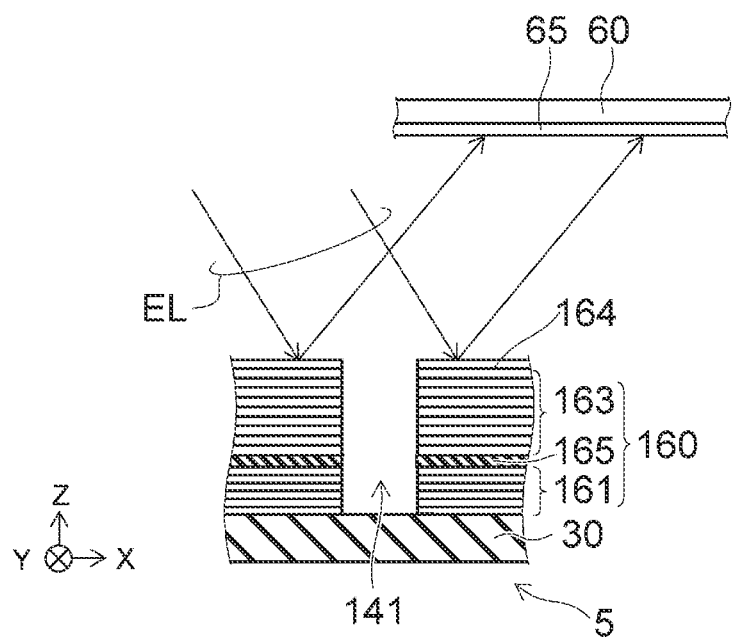
FIGS. 8A and 8B are schematic diagrams illustrating a characteristic of a lithography mask of a comparative example.
Figure 8B:
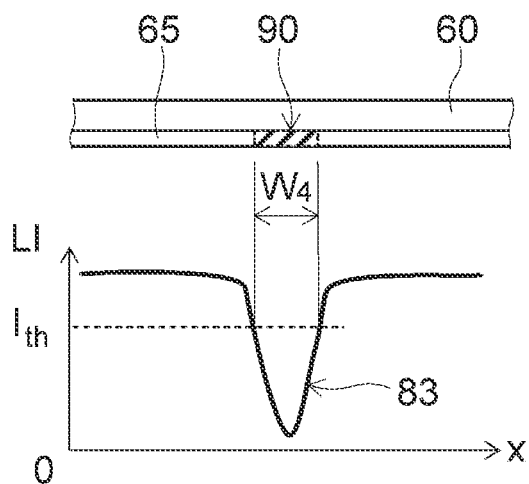

FIGS. 8A and 8B are schematic diagrams illustrating a characteristic of a lithography mask 5 of a comparative example. As shown in FIG. 8A, whereas a reflection layer 160 of the lithography mask 5 has a first hole 141, it has neither the second hole 151a nor the third hole 151b. A reflection component of exposure light EL that is reflected from the reflection layer 160 shines on a wafer 60. The surface of the wafer 60 is coated with a photoresist 65.

FIG. 8B shows an intensity distribution 83 of the reflection component of exposure light EL that shines on the photoresist 65. The horizontal axis represents the position in the X direction and the vertical axis represents the intensity LI of the reflection component of the exposure light EL. The intensity distribution 83 indicates that the intensity LI dips at a position corresponding to the first hole 141.

A portion of the photoresist 65 that is illuminated with a portion, having a higher intensity than the intensity $I_{th}$, of the reflection component of exposure light EL reacts to it and is removed by the exposure. On the other hand, a portion of the photoresist 65 that is illuminated with a portion, having a lower intensity than the intensity $I_{th}$, of the reflection component of exposure light EL remains on the wafer 60. A lithography image is thus formed.

The width $W_4$ of an optical image 90 in the X direction depends on, for example, the threshold sensitivity level $I_{th}$ and becomes smaller as $I_{th}$ lowers. In other words, the width of the optical image 90 in the X direction becomes smaller as the exposure sensitivity of the photoresist 65 increases. As a result, there may occur an event that the width $W_4$ of the optical image 90 in the X direction becomes smaller than a desired value.

In contrast, in the embodiment, the second hole 151a and the third hole 151b are formed to be closest to the both sides of the first hole 141, respectively. The second hole 151a and the third hole 151b decrease the reflectivity at the portions located on the two respective sides of the first hole 141 and thereby increase the width $W_3$ of the optical image 80 in the X direction (see FIG. 7B). As a result, narrowing of the optical image 80 is suppressed and a desired width can be realized.

It is desirable that the second hole 151a and the third hole 151b not cause the intensity LI of the reflection component of the exposure light EL to fall to such extent as to become lower than $I_{th}$, that is, the quantity of light reflected from each of the second hole 151a and the third hole 151b be larger than the resolution limit level of the photoresist 65.

Next, a manufacturing method of the lithography mask 4 according to the second embodiment will be described with reference to FIGS. 9A-9C and FIGS. 10A and 10B. FIGS. 9A-9C and FIGS. 10A and 10B are schematic sectional views illustrating a manufacturing process of the lithography mask 4 in order.

Figure 9A:
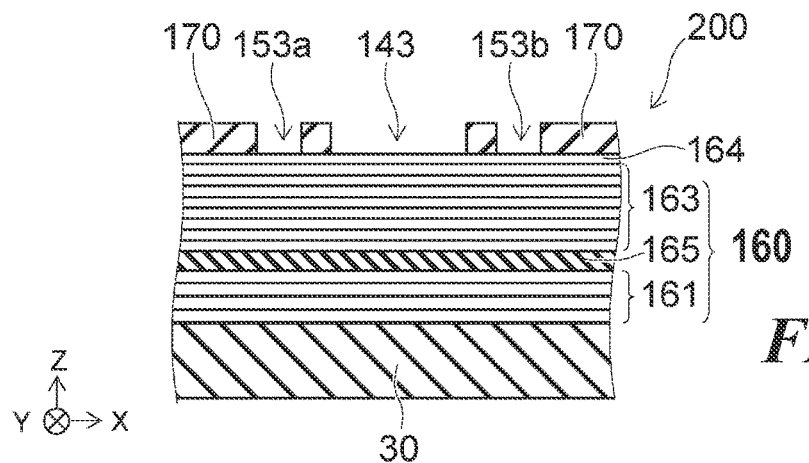
FIGS. 9A-9C are a first set of schematic sectional views illustrating a manufacturing process of the light reflection type lithography mask according to the second embodiment.

FIG. 9A is a schematic sectional view showing a mask blank 200 that is used for manufacture of the lithography mask 4 and an etching mask 170 formed thereon. The mask blank 200 has a substrate 30 and a reflection layer 160 formed thereon. The reflection layer 160 has a first lamination portion 161, a second lamination portion 163, and an intermediate layer 165. The first lamination portion 161 is formed on the substrate 30. The intermediate layer 165 is formed between the first lamination portion 161 and the second lamination portion 163. A cap layer 164 is formed on the second lamination portion 163. Each of the first lamination portion 161 and the second lamination portion 163 includes first layers 33 and second layers 35 (see FIG. 6B). For example, the intermediate layer 165 is a silicon oxide film.

The etching mask 170 has a first opening 143 and second openings 153a and 153b. The first opening 143, the second opening 153a, and the second opening 153b have the shapes of the first pattern 140, the second pattern 150a, and the third pattern 150b as viewed from above, respectively. For example, the etching mask 170 is formed by selectively removing a hard mask layer (see FIG. 3A) formed on the second lamination portion 163.

For example, the etching mask 170 has a multilayer structure that a tantalum nitride layer and a tantalum oxide layer are laid successively. The cap layer 164 is a ruthenium layer, for example. The uppermost layer of the second lamination portion 163 is a silicon layer, for example, and the cap layer 164 is formed directly on the silicon layer.

Figure 9B:
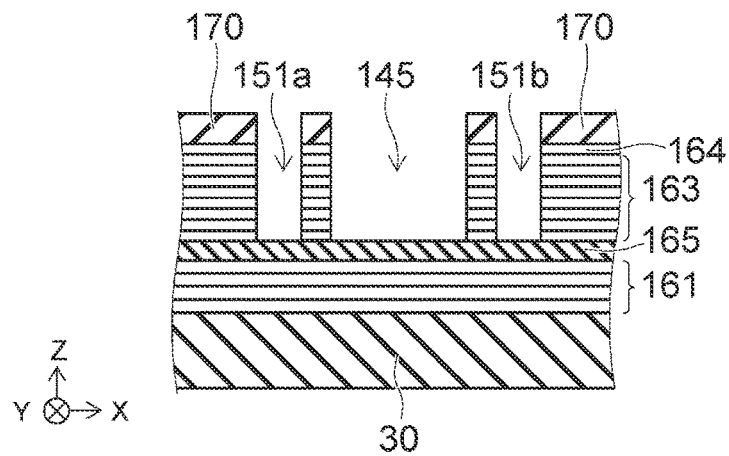

As shown in FIG. 9B, the second lamination portion 163 is removed selectively using the etching mask 170, whereby a first hole 145 and second hole 151a and the third hole 151b are formed. The intermediate layer 165 is exposed at the bottoms of the first hole 145 and the second hole 151a and the third hole 151b. For example, the second lamination portion 163 is removed selectively under such conditions that the first layers 33 and the second layers 35 are etched and the intermediate layer 165 is not. Alternatively, the second lamination portion 163 may be removed selectively under such conditions that the etching rates of the first layers 33 and the second layers 35 are higher than the etching rate of the intermediate layer 165. Thus, the intermediate layer 165 functions as an etching stopper.

Figure 9C:
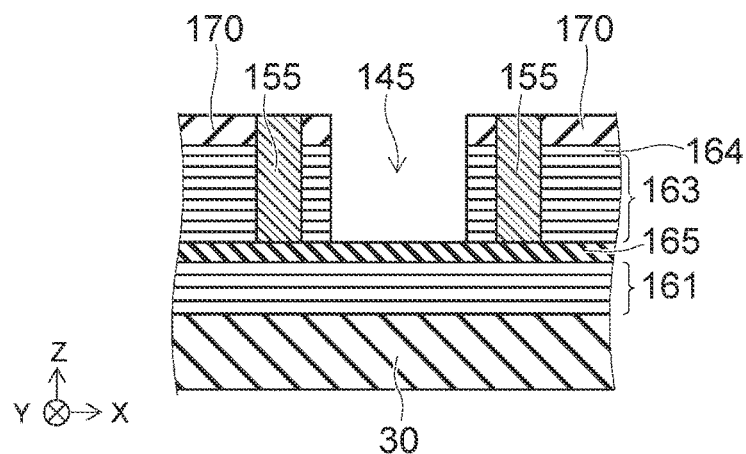

As shown in FIG. 9C, a resist 155 is formed so as to fill in the inside spaces of the second hole 151a and the third hole 151b. Although in this embodiment the resist 155 is charged into the inside spaces of the second hole 151a and the third hole 151b, the embodiment is not limited to such a case. For example, the resist 155 may be formed so as to not only fill in the inside spaces of the second hole 151a and the third hole 151b but also cover the top surface of the etching mask 170.

Figure 10A:
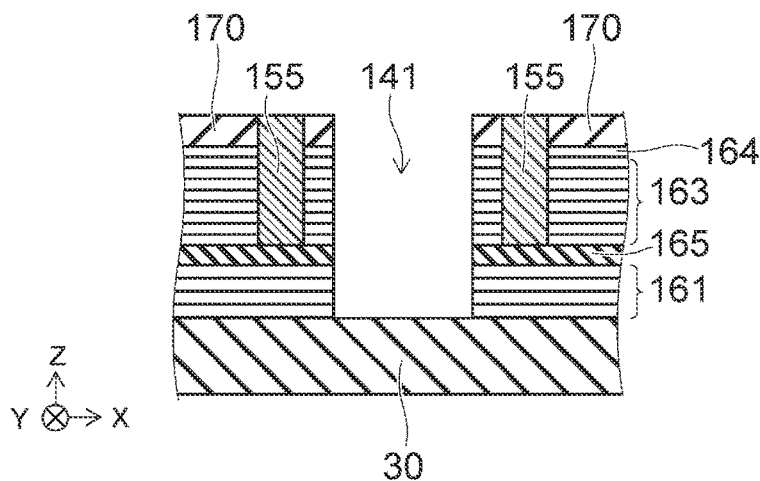
FIGS. 10A and 10B are a second set of schematic sectional views illustrating a manufacturing process of the light reflection type lithography mask subsequent to the manufacturing process shown in FIG. 8.

As shown in FIG. 10A, a portion of the intermediate layer 165 that is exposed at the bottom of the first hole 145 and a portion of the first lamination portion 161 right under that portion of the intermediate layer 165 are removed using the etching mask 170 and the resist 155. As a result, a first hole 141 is formed so as to expose a portion of the substrate 30. The intermediate layer 165 and the first lamination portion 161 are removed selectively by anisotropic RIE, for example.

Figure 10B:
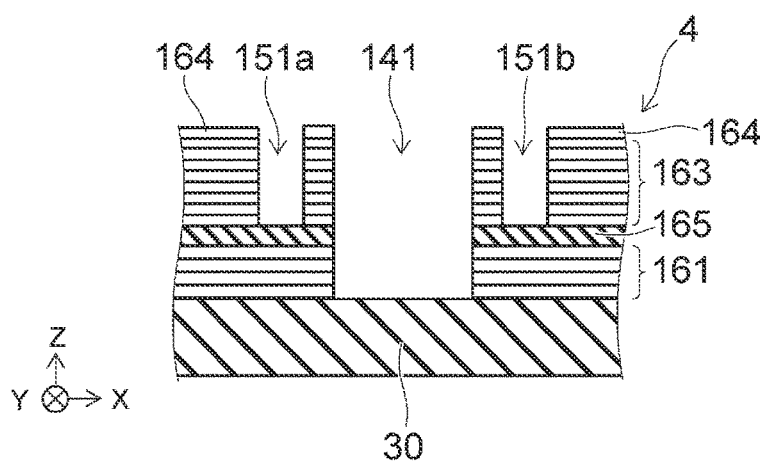

As shown in FIG. 10B, the etching mask 170 and the resist 155 are removed, whereby a lithography mask 4 is completed. In the embodiment, the intermediate layer 165 functions as an etching stopper, as a result of which the second hole 151a and the third hole 151b can be formed so as to have the same depth.

Embodiment 3

Figure 11:
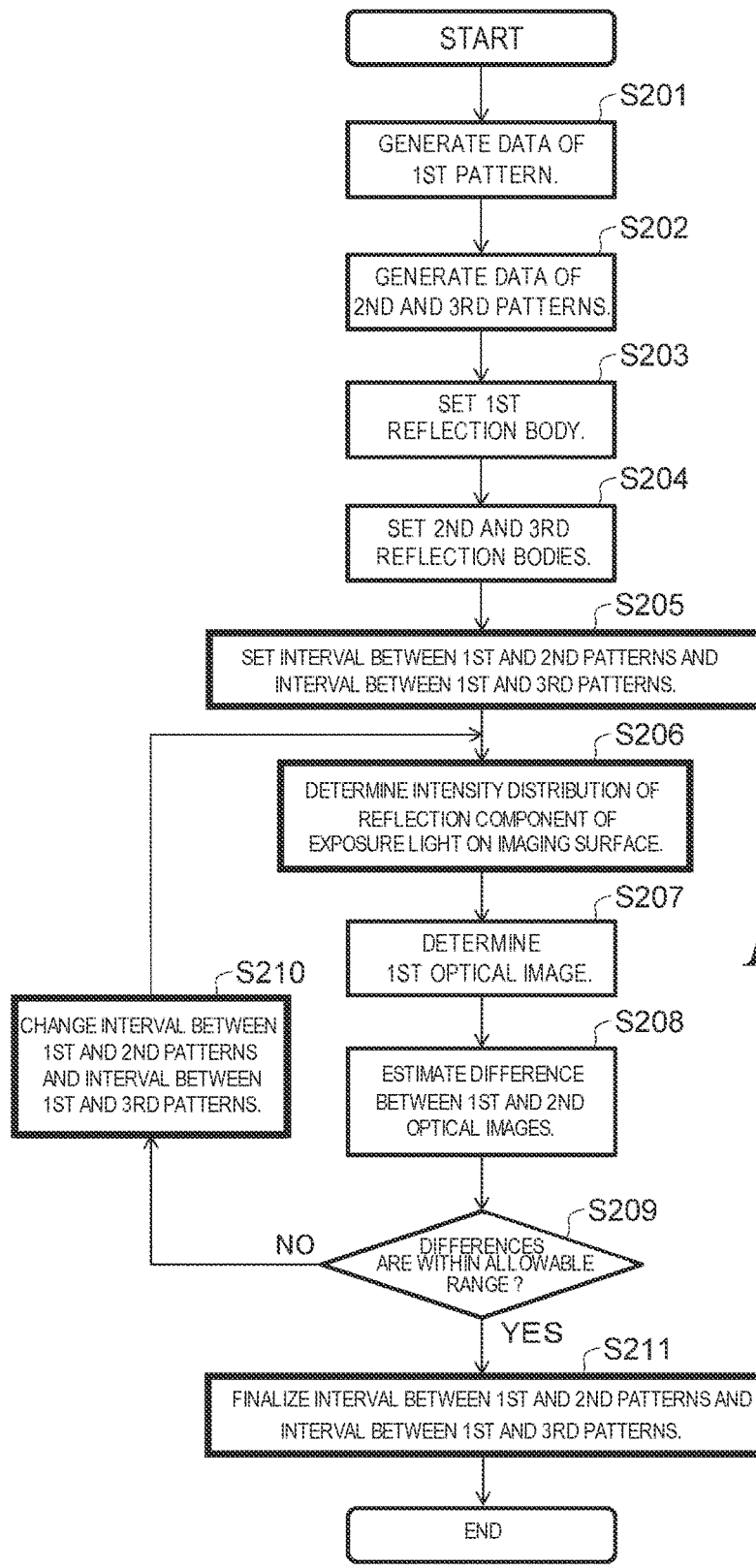
FIG. 11 is a flowchart of a mask data generation process.
Figure 12A:
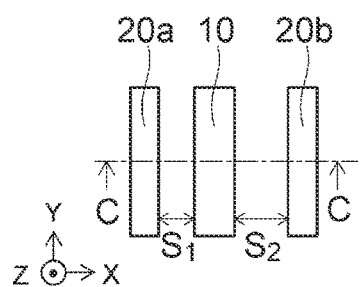
FIGS. 12A and 12B are schematic diagrams illustrating a mask data generation method.
Figure 12B:
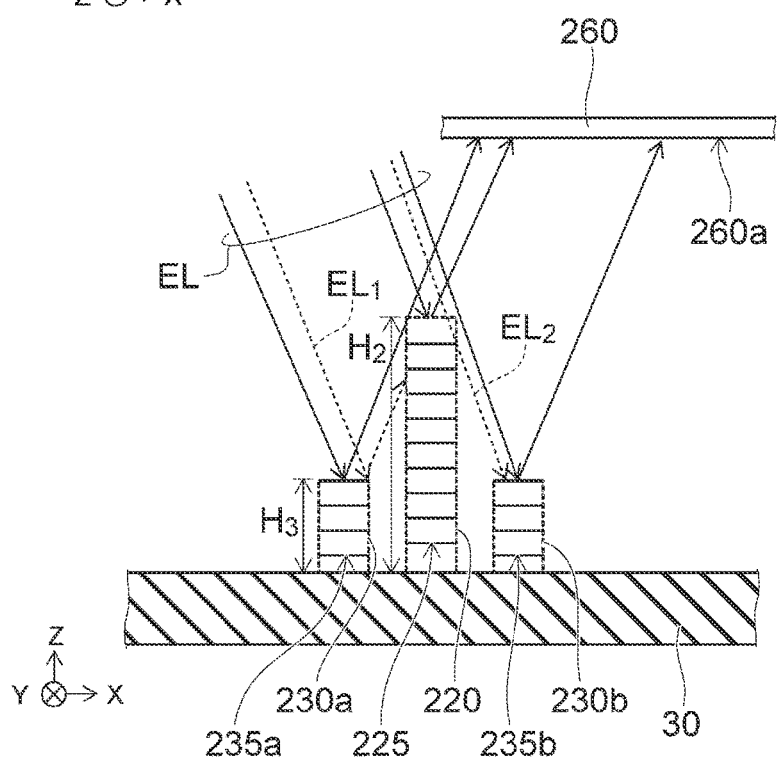
Figure 13:
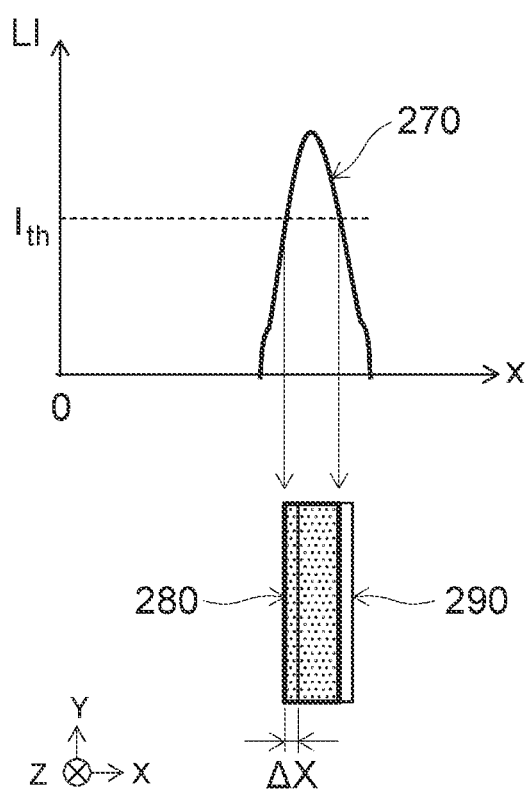
FIG. 13 is another schematic diagram illustrating the mask data generation method.

Next, a method for generating mask data to be used for electron beam exposure will be described with reference to FIGS. 11-13. FIG. 11 is a flowchart of a mask data generation process. FIG. 12A is a plan view showing a pattern arrangement of a lithography mask 2, and FIG. 12B is a schematic sectional view of the lithography mask 2 taken along line C-C in FIG. 12A. FIG. 13 is a schematic diagram showing a relationship between an intensity distribution 270 of exposure light on a wafer 260 and a first optical image 280.

Steps S201-S211 shown in FIG. 11 are executed by a control unit of an electron beam exposing instrument to generate mask data. Steps S201-S211 will be described below in order.

Step S201: Data of a first pattern 10 shown in FIG. 12A is generated. That is, the first pattern 10 is converted into first sets of relative coordinates (numerical data). For example, "sets of relative coordinates" include plural sets of relative coordinates representing a start point, and end point, and passing points of an electron beam for drawing of a pattern (e.g., pattern 10).

Step S202: Data of a second pattern 20a and a third pattern 20b shown in FIG. 12A are generated. That is, the second pattern 20a and the third pattern 20b are converted into second sets of relative coordinates and third sets of relative coordinates (numerical data), respectively.

Step S203: A first reflection body 220 is set (its numerical data is generated) which has the shape of the first pattern 10 as viewed from above and a height $H_2$ as measured from a substrate 30. The first reflection body 220 includes plural reflection surfaces 225 which have, for example, the shape of the first pattern 10 as viewed from above and are arranged in the Z direction. For example, the first reflection body 220 corresponds to the first lamination body 40 (see FIG. 1) and has the reflection surfaces 225 that correspond to the interfaces between the first layers 33 and the second layers 35.

Step S204: A second reflection body 230a and a third reflection body 230b are set (their numerical data are generated) which have the shapes of the second pattern 20a and the third pattern 20b, respectively, as viewed from above and a height $H_3$ as measured from the substrate 30. For example, sets of relative coordinates are set for sets of plural reflection surfaces 230a and sets of plural reflection surfaces 230b which have, for example, the shape of the second pattern 20a and the third pattern 20b as viewed from above, respectively, and are arranged in the Z direction. For example, the second reflection body 230a corresponds to the second lamination body 50 (see FIG. 1) and has reflection surfaces 235a that correspond to the interfaces between the first layers 33 and the second layers 35. The third reflection body 230b is similar in structure to the second reflection body 230a.

Step S205: An interval $S_1$ between the first pattern 10 and the second pattern 20a and an interval $S_2$ between the first pattern 10 and the third pattern 20b are set. As a result, first sets of coordinates, second sets of coordinates, and third sets of coordinates that represent the first reflection body 220, the second reflection body 230a, and the third reflection body 230b on the substrate 30, respectively, are determined.

Step S206: An intensity distribution, on the surface (hereinafter referred to as an imaging surface 260a) of the wafer 260, of a reflection component of exposure light EL that is reflected from the first reflection body 220, the second reflection body 230a, and the third reflection body 230b is determined.

For example, exposure light EL shines on the lithography mask 2 obliquely from a direction that is inclined from the Z direction by 6° and in the X direction as viewed from above. The exposure light EL is assumed to be parallel light having a uniform intensity profile. An intensity distribution 270 is determined by integrating intensities of reflection components of exposure rays EL that are reflected from sets of coordinates that are set in the reflection surfaces 225, 235a, and 235b of the first reflection body 220, the second reflection body 230a, and the third reflection body 230b and reach each of sets of coordinates on the imaging surface 260a. This is done based on reflectivities and transmittances of the reflection surfaces 225, 235a, and 235b that exist in the traveling paths of the light. For example, as shown in FIG. 12B, a ray $EL_1$ that is reflected by the second reflection body 230a, passes through the first reflection body 220, and reaches the imaging surface 260a and a ray $EL_2$ that passes through the first reflection body 220, is reflected by the third reflection body 230b, and reaches the imaging surface 260a are included in the calculation.

Step S207: A first optical image 280 is determined based on an intensity distribution 270 of the reflection component of the exposure light EL on the imaging surface 260a and a threshold sensitivity level $I_{th}$ of a photoresist. For example, a first optical image 280 including sets of coordinates that are associated with intensities of the reflection component of the exposure light EL that are higher than the threshold sensitivity level $I_{th}$ is determined.

Step S208: A difference between the first optical image 280 and a preset second optical image 290 is estimated. For example, as shown in FIG. 13, a positional deviation ΔX in the X direction between the first optical image 280 and the preset second optical image 290 is estimated. The difference between the first optical image 280 and the preset second optical image 290 is not limited to the positional deviation ΔX; it may be a difference between the widths of the first optical image 280 and the preset second optical image 290 in the X direction.

Step S209: It is judged whether or not the difference between the first optical image 280 and the preset second optical image 290 is within an allowable range.

For example, if the absolute value of the difference between the first optical image 280 and the preset second optical image 290 is larger than the allowable range, the process moves to step S210, where the intervals $S_1$ and $S_2$ are changed. And first sets of coordinates representing the first reflection body 220, second sets of coordinates representing the second reflection body 230a, and third sets of coordinates representing the third reflection body 230b are newly determined Steps S206-S208 are then executed again, whereby whether or not a difference between a new first optical image 280 and the preset second optical image 290 is within the allowable range is judged.

If the absolute value of the difference between the first optical image 280 and the preset second optical image 290 is within the allowable range, the process moves to step S211, where the interval $S_1$ between the first pattern 10 and the second pattern 20a and the interval $S_2$ between the first pattern 10 and the third pattern 20b are finalized. In this manner, mask data of the first pattern 10, the second pattern 20a, and the third pattern 20b can be determined.

By using a lithography mask that is produced using mask data generated according to this embodiment, the accuracy of dimensions of an optical image formed on a wafer can be made higher. As a result, the production yield of a semiconductor device can be increased.

Although in the first to third embodiments exposure light is incident in the X direction as viewed from above and the patterns extend in the Y direction, the invention is not limited to such a case. That is, the extending direction of patterns of a lithography mask is not limited to the direction that is perpendicular to the incidence direction of exposure light; it suffices that the extending direction of patterns of a lithography mask cross the incidence direction of exposure light.

Although the several embodiments of the invention have been described above, they are just examples and should not be construed as restricting the scope of the invention. Each of these novel embodiments may be practiced in various other forms, and part of it may be omitted, replaced by other elements, or changed in various manners without departing from the spirit and scope of the invention. These modifications are also included in the invention as claimed and its equivalents.

The invention claimed is:

1. A light reflection type lithography mask comprising:
    a substrate that extends in a first direction and a second direction perpendicular to the first direction; and
    a reflection layer which is formed on the substrate and has a first pattern and a second pattern next to each other in the first direction with an interval between the first pattern and the second pattern, as viewed from above,
    wherein the first pattern has a first shape longer in the second direction than the first direction, the first shape having a first side edge and a second side edge, each of which extends in the second direction,
    wherein the second pattern has a second shape longer in the second direction than the first direction and is located at a position closer to one of the first side edge or the second side edge of the first pattern,
    wherein the reflection layer has a first reflectivity at a portion corresponding to the first pattern and a second reflectivity at a portion corresponding to the second pattern, the second reflectivity being different from the first reflectivity.

2. The light reflection type lithography mask of claim 1, wherein the reflection layer comprises:
    a first lamination body having a shape of the first pattern, as viewed from above, and
    a second lamination body having a shape of the second pattern, as viewed from above, and
    wherein a thickness of the first lamination body in a third direction that is perpendicular to the substrate is greater than a thickness of the second lamination body in the third direction.

3. The light reflection type lithography mask of claim 2, wherein the second lamination body includes a sub-resolution assist feature (SRAF).

4. The light reflection type lithography mask of claim 2, wherein the second lamination body has a reflectivity that is smaller than a reflectivity of the first lamination body.

5. The light reflection type lithography mask of claim 2, wherein a peak of an intensity distribution of a reflected component of an exposure light is lower than a threshold sensitivity level after reflection from the second lamination body.

6. The light reflection type lithography mask of claim 1, wherein the reflection layer has:

a first hole having a shape corresponding to first shape of the first pattern, and a second hole having a shape corresponding to the second shape of the second pattern, and wherein a depth of the second hole in the third direction is smaller than a depth of the first hole in the third direction.

7. The light reflection type lithography mask of claim 6, wherein a reflectivity of the reflection layer at the second hole is larger than a reflectivity of the reflection layer at the first hole.

8. The light reflection type lithography mask of claim 1, wherein the reflection layer comprises:

first layers of a first material and a first refractive index, and second layers of a second material and a second refractive index different from the first refractive index, and wherein an uppermost layer of a portion of the reflection layer having the second shape of the second pattern, as viewed from above, contains a third material that is different from the first and second materials.

9. The light reflection type lithography mask of claim 1, wherein the reflection layer further has a third pattern located beside the first pattern in the first direction such that the first pattern is located between the second pattern and the third pattern, and wherein an interval between the first pattern and the second pattern is different from an interval between the first pattern and the third pattern.

10. A mask blank comprising:

a substrate;

a reflection layer in which first layers and second layers are laid one on another, refractive index of the second layers being different from refractive index of the first layers; and a third layer that is located between an uppermost layer and a lowermost layer of the reflection layer and contains a material that is different from materials constituting the first layers and the second layers.

11. A manufacturing method of a light reflection type lithography mask, the method comprising:

forming a first etching mask having a first pattern on a mask blank, the mask blank including a substrate, a first lamination portion formed on the substrate, an etching stopper layer formed on the first lamination portion, and a second lamination portion formed on the etching stopper layer;

selectively removing the second lamination portion using the first etching mask;

forming a second etching mask having a second pattern on the etching stopper layer exposed by selectively removing the second lamination portion, the second etching mask being to one side of the first etching mask and closest to the a portion of the first etching mask in a first direction that is parallel with the substrate, the portion of the first etching mask corresponding to the first pattern; and selectively removing the etching stopper layer and the first lamination portion using the first etching mask and the second etching mask.

12. The manufacturing method of claim 11, wherein the second lamination portion has a reflectivity that is smaller than a reflectivity of the first lamination portion.

13. A manufacturing method of a light reflection type lithography mask, the method comprising:

forming an etching mask having a first opening and a second opening to be to one side of the first opening and closest to the one side of the first opening on a mask blank, the mask blank including a substrate, a first lamination portion formed on the substrate, an etching stopper layer formed on the first lamination portion, and a second lamination portion formed on the etching stopper layer;

selectively removing portions of the second lamination portion, the etching stopper layer, and the first lamination portion under the first opening; and selectively removing a portion of the second lamination portion under the second opening.

* * * * *